United States Patent [19]
Sato et al.

[11] Patent Number: 6,054,798
[45] Date of Patent: *Apr. 25, 2000

[54] PIEZOELECTRIC TRANSFORMER WITH AN IMPROVED ARMOR CASE

[75] Inventors: Yuko Sato; Mitsuhiro Sugimoto, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/014,576

[22] Filed: Jan. 28, 1998

[30] Foreign Application Priority Data

Jan. 28, 1997 [JP] Japan ................................. 9-014281

[51] Int. Cl.⁷ ................................................. H03H 9/02
[52] U.S. Cl. ................................ 310/348; 310/352
[58] Field of Search ............................ 310/340, 348, 310/352, 353, 354, 357

[56] References Cited

U.S. PATENT DOCUMENTS

| | | | |
|---|---|---|---|
| 3,619,672 | 11/1971 | Nagata et al. | 310/353 |
| 4,267,480 | 5/1981 | Kanematsu et al. | 310/366 |
| 4,583,017 | 4/1986 | Nakamura et al. | 310/348 |
| 4,695,756 | 9/1987 | Tanaka | 310/355 |
| 4,779,246 | 10/1988 | Dietzsch et al. | 310/348 |
| 5,203,537 | 4/1993 | Jacobs et al. | 310/330 |
| 5,747,916 | 5/1998 | Sugimoto et al. | 310/348 |
| 5,847,491 | 12/1998 | Taihaku et al. | 310/355 |

*Primary Examiner*—Thomas M. Dougherty
*Attorney, Agent, or Firm*—Young & Thompson

[57] ABSTRACT

A piezoelectric transformer includes a molded package having first and second inner walls facing each other, a plurality of pairs of projections provided on the first and second inner walls, and a piezoelectric transformer element mechanically supported by the projections so that the piezoelectric transformer element is accommodated in an internal space defined by inner walls of the molded package but separated from the inner walls of the molded package. As a result, the thickness of the package can be reduced.

10 Claims, 8 Drawing Sheets

PIEZOELECTRIC TRANSFORMER WITH AN IMPROVED ARMOR CASE

BACKGROUND OF THE INVENTION

The present invention relates to a piezoelectric transformer usable in various high voltage power supplies, and more particularly to a piezoelectric transformer scaled down to have a small size and a reduced thickness as well as having high reliability and the ability to generate a high voltage, in addition a packaging method and a packaging structure and furthermore relates to a input and output terminals of the piezoelectric transformer and its circuit interconnection. The high power supply is used, for example, in a deflector for a television system and an electro static charge device for a copy machine. A wound electromagnetic transformer has been used as a transformer for generating a high voltage. The wound electromagnetic transformer has a magnetic core wound with wires. In order to realize a high ratio of transformation, it is required to increase the number of wires wound around the magnetic core. The increased number of wires wound around the magnetic core makes it difficult to realize a small size and thin electromagnetic transformer.

Figure 1:
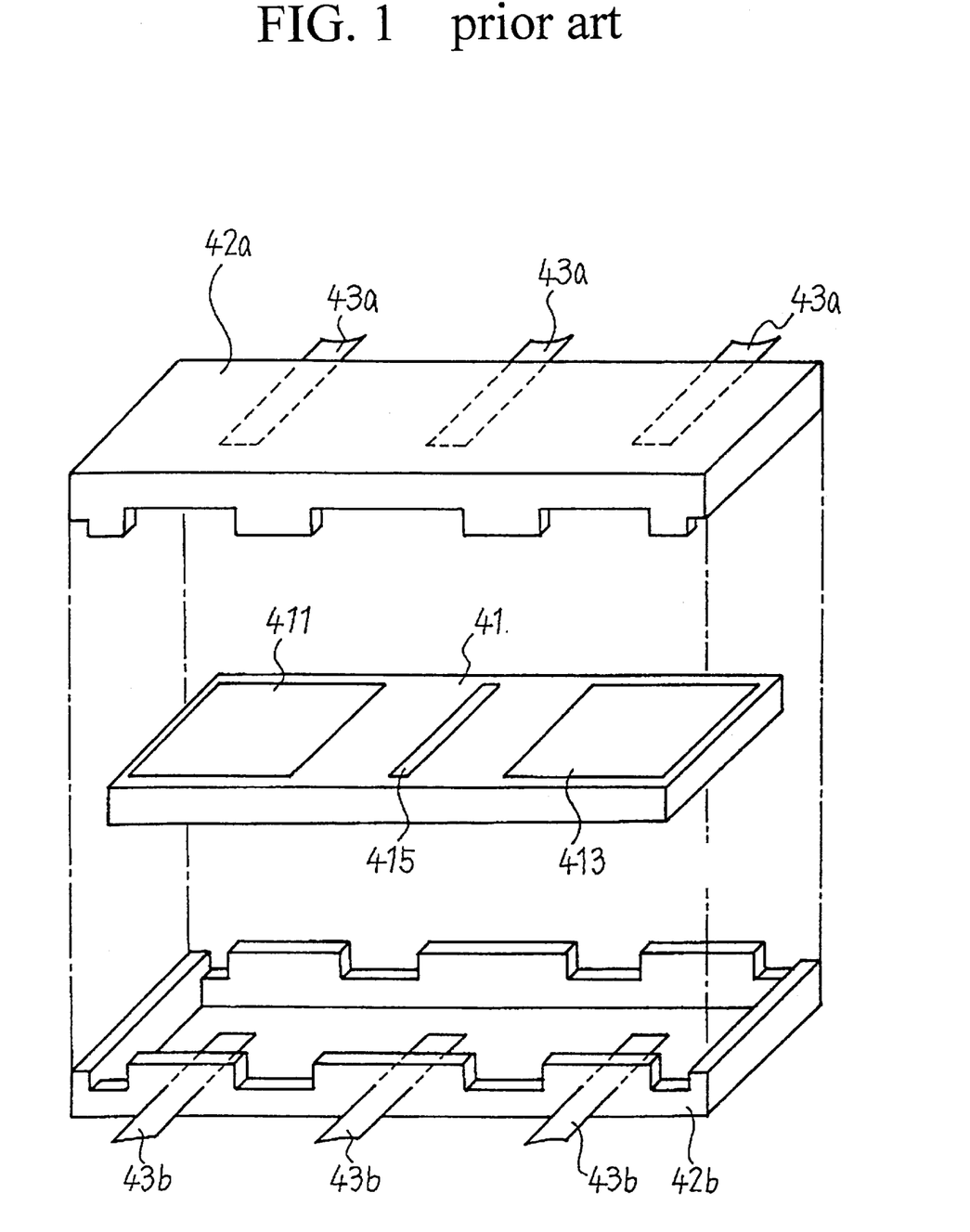
FIG. 1 is a schematic perspective view illustrative of the conventional piezoelectric transformer having the spring contact structure.
Figure 2:
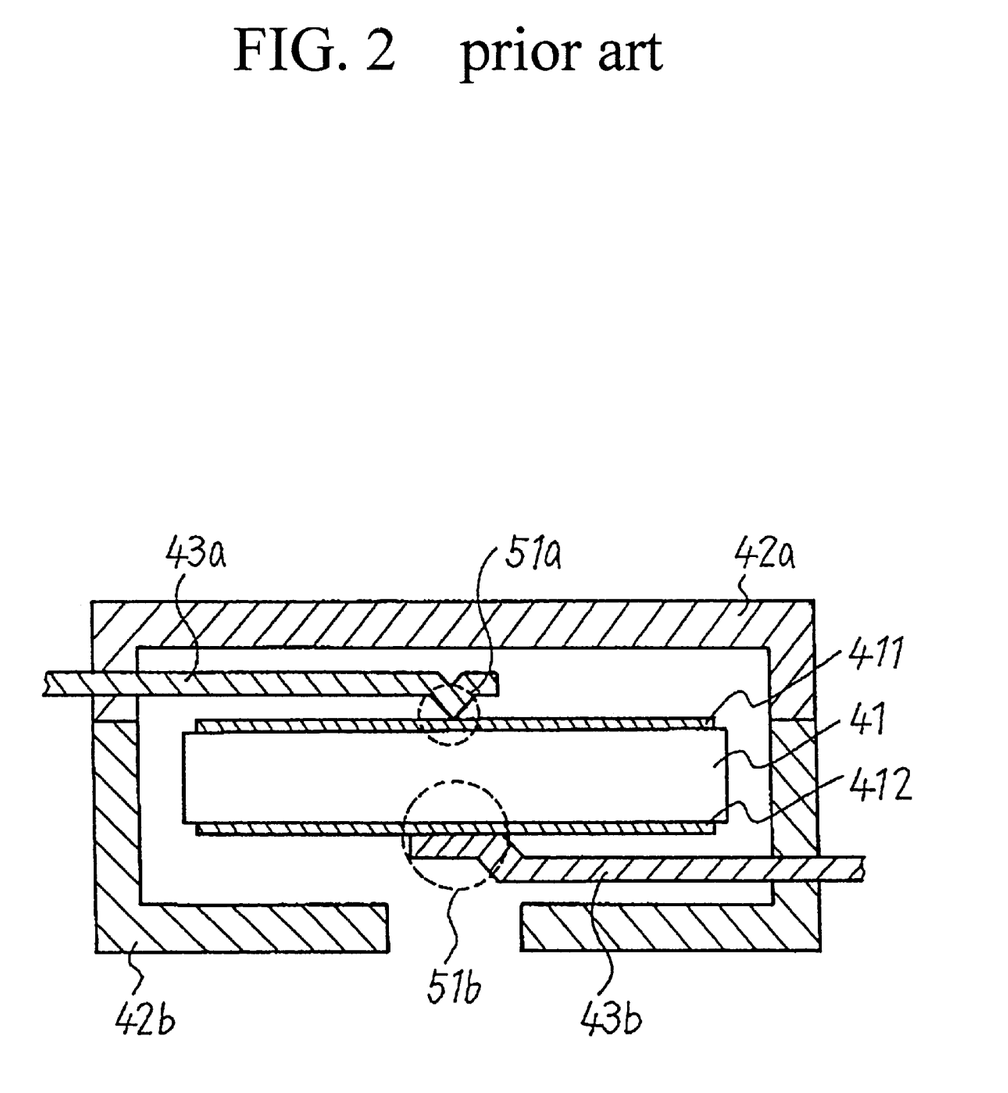
FIG. 2 is a cross sectional elevation view illustrative of the conventional piezoelectric transformer of FIG. 1.

In order to settle the above issue in obtaining both the generated high voltage and the scaling down of the electromagnetic transformer, another transformer has been proposed which utilizes a piezoelectric effect. The piezoelectric transformer has a piezoelectric body with a main face on which electrodes are provided for applications of alternating currents to the electrodes in order to cause a vibration of the piezoelectric body. It is of course important that the piezoelectric transformer is packaged in a molded so as to prevent any disturbance to the vibration of the piezoelectric body. In the Japanese laid-open patent publication No. 7-39912, it is disclosed that the piezoelectric transformer having a spring contact structure. FIG. 1 is a schematic perspective view illustrative of the conventional piezoelectric transformer having the spring contact structure. FIG. 2 is a cross sectional elevation view illustrative of the conventional piezoelectric transformer of FIG. 1.

A piezoelectric transformer 41 is packaged in upper and bottom molded packages 42a and 42b. Namely, the piezoelectric transformer 41 is accommodated in an internal space formed by the upper and bottom molded packages 42a and 42b and is held in the internal space by spring forces provided by upper and lower lead terminals 43a and 43b. The upper lead terminals 43a extend from a side wall of the upper molded package 42a to the internal space. The lower lead terminals 43b extend from a side wall of the lower molded package 42b to the internal space. Top portions of the upper lead terminals 43a have first contact portions 51a. Top portions of the lower lead terminals 43b have second contact portions 51b. The first contact portions 51a of the upper lead terminals 43a are positioned right over the second contact portions 51b of the lower lead terminals 43b. The first contact portions 51a are distanced in a vertical direction from the second contact portions 51b by a distance about a thickness of the piezoelectric transformer element 41 so that the first contact portions 51a of the upper lead terminals 43a are in secure contact with an upper surface of the piezoelectric transformer element 41 by pressing the upper surface downwardly, whilst the second contact portions 51b of the lower lead terminals 43b are in securely contact with a lower surface of the piezoelectric transformer element 41 by pressing the lower surface upwardly. As a result, the piezoelectric transformer element 41 is held by the spring forces provided by the upper and lower lead terminals 43a and 43b. This packaging method is inferior in facilitation of assembling and packaging of the piezoelectric transformer element 41. Top and bottom electrodes 411 and 412 are provided on the upper and lower surfaces of the piezoelectric transformer element 41.

Figure 3:
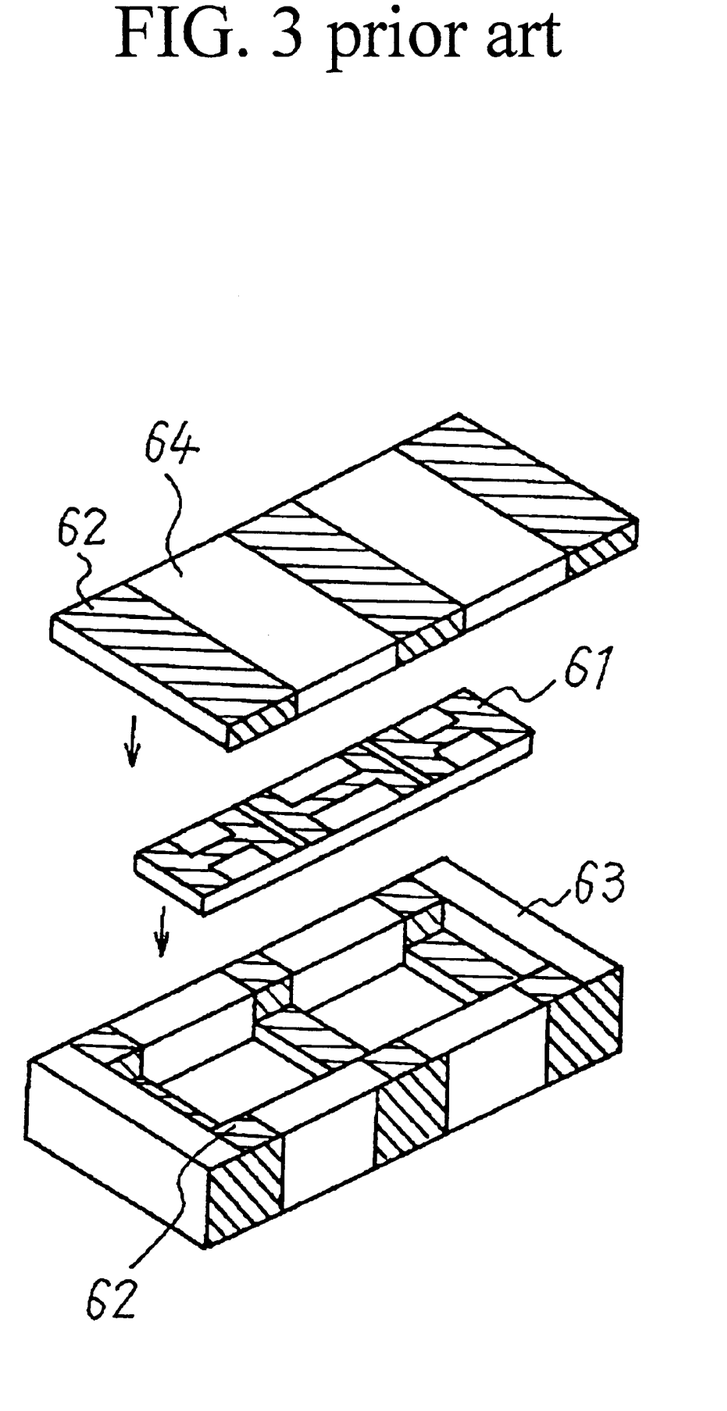
FIG. 3 is a schematic view illustrative of the conventional vibration electronic device packaged in the molded package.

Japanese laid-open patent publication No. 6-6164, discloses that a vibration electronic device is packaged in a molded package. FIG. 3 is a schematic view illustrative of a conventional vibration electronic device packaged in the mold package. A resonator 61 is accommodated in a case 63 with a cap 64. The case 63 is formed with plated wirings 62. The cap 64 is also formed with the plated wirings 62. The resonator 61 is also formed with the plated wirings 62. The resonator 61 is fixed to the case 63 by an electrically conductive adhesive for electrical connection between the plated wirings 62 of the resonator 61 and the case 63 and between the plated wirings 62 of the resonator 61 and the cap 64.

Figure 4:
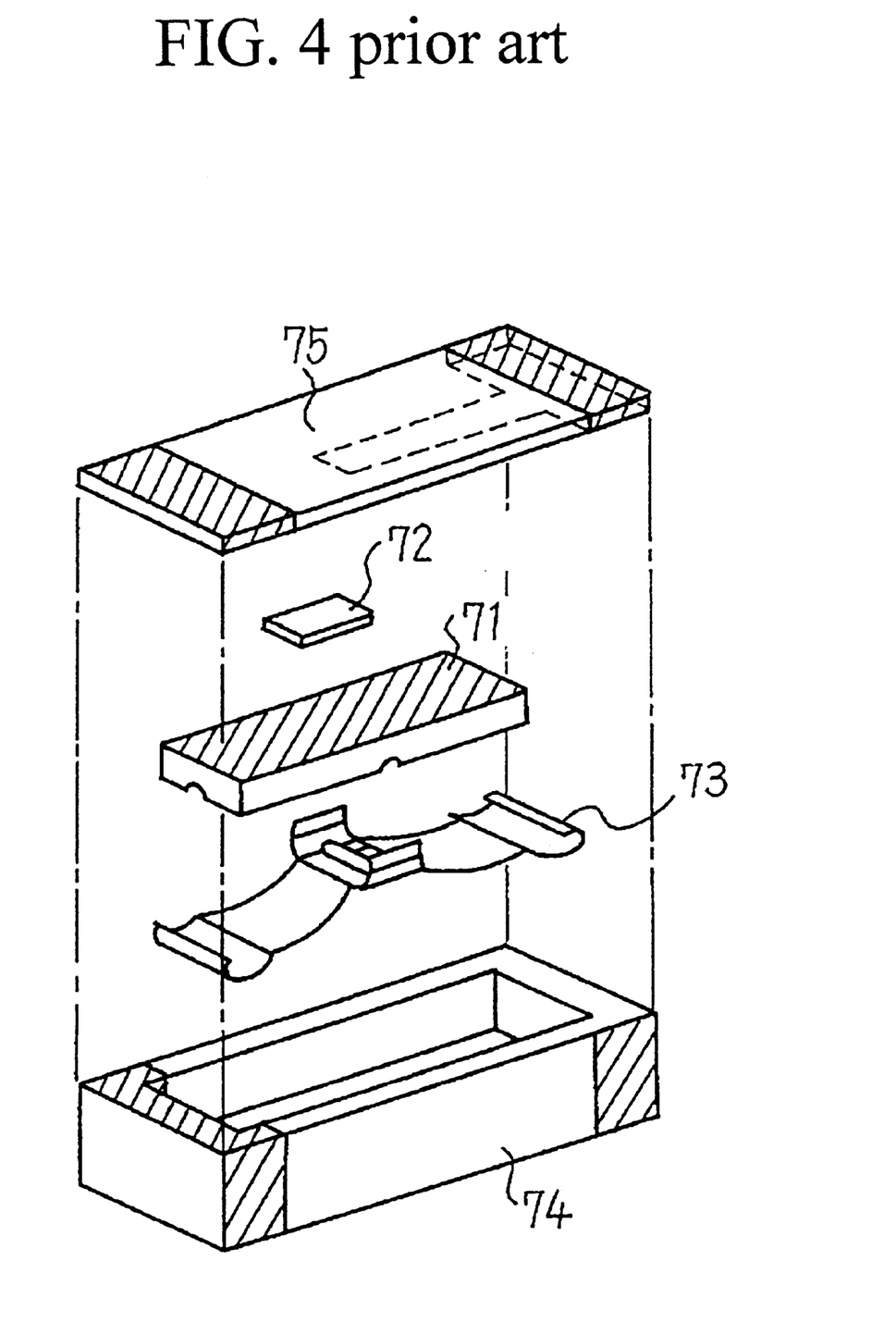
FIG. 4 is a schematic view illustrative of a conventional vibration electronic device packaged in the molded package.

Japanese laid-open patent publication No. 5-243886, discloses that a vibration electronic device is packaged in a molded package. FIG. 4 is a schematic view illustrative of a conventional vibration electronic device packaged in the molded package. A resonator 71 is accommodated in a ceramic case 73 with a ceramic cap 74 via a conductive sheet 72 and a spring terminal 73.

Figure 5:
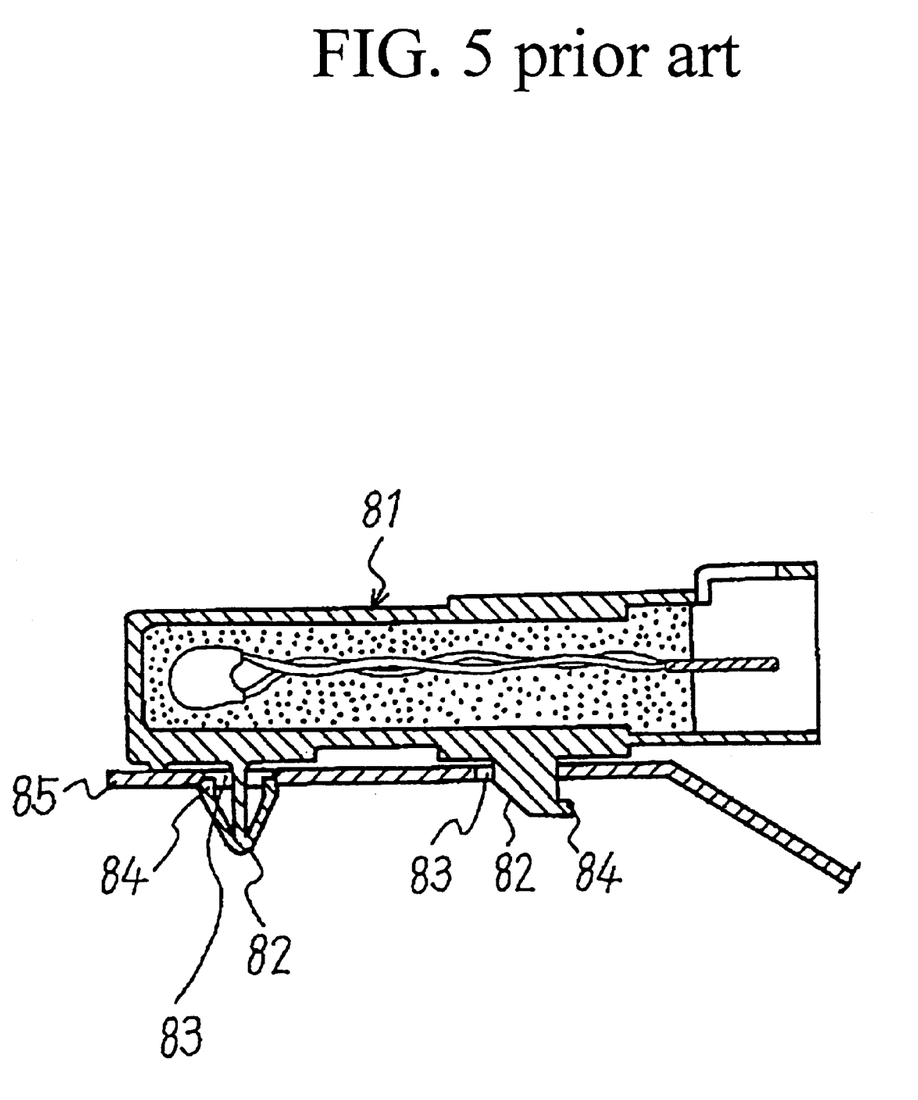
FIG. 5 is a cross sectional elevation view illustrative of a conventional packaging structure wherein a case is latched to a bottom plate.

Japanese laid-open utility model publication No. 5-3950, discloses that an electronic device is packaged in another molded package. FIG. 5 is a cross sectional elevation view illustrative of a conventional packaging structure wherein a case is latched to a bottom plate. A molded package 81 has snap fits 84 with latches 82. A bottom plate 85 has through holes 83 so that the snap fits 84 snap into the through holes 83 and the latches 82 of the snap fits 84 latch with the bottom plate 85.

The above described prior arts have the following problems and disadvantages individually.

The first prior art disclosed in the Japanese laid-open patent publication No. 7-39912 has the following problems. In order to allow the lead frames to have a spring force, it is required to provide gaps between the lead frames and the molded package as illustrated in FIG. 2, for which reason the thickness of the package is increased. Further for packaging onto the substrate, there are required processes for folding the lead frames whereby the manufacturing cost is increased.

The second prior art disclosed in the Japanese laid-open patent publication No. 6-6164 has the following problem. The resonator and the wiring are bonded to each other via the electrically conductive adhesive. This bonding structure by the electrically conductive adhesive prevents the resonator from showing vibration. It is further possible that the case and the resonator are bent or arched.

The third prior art disclosed in the Japanese laid-open patent publication No. 5-24886 has the following problem. Since the resonator is held by the conductive sheet and the spring terminal and accommodated in the molded package the thickness of the package is increased.

The fourth prior part disclosed in the Japanese laid-open patent publication No. 6-6164 has the following problem. The latching structure is provided to latch the molded package to the bottom plate. No further function can be obtained.

In the above circumstances, it had been required to develop a novel packaging structure for a piezoelectric transformer free from the above problem.

SUMMARY OF THE INVENTION

Accordingly, it is an object of the present invention to provide a novel packaging structure for a piezoelectric transformer free from the above problems.

It is a further object of the present invention to provide a novel packaging structure for a piezoelectric transformer in which a thickness of the package can be reduced.

It is a still further object of the present invention to provide a novel packaging structure for a piezoelectric transformer allowing a piezoelectric element to show a vibration without any disturbance to the vibration.

It is yet a further object of the present invention to provide a novel packaging structure for a piezoelectric transformer allowing easily and simply packaging the piezoelectric transformer.

The above and other objects, features and advantages of the present invention will be apparent from the following descriptions. present invention provides a piezoelectric transformer comprising a molded package having first and second inner walls facing each other, a plurality of pairs of projections provided on the first and second inner walls, and a piezoelectric transformer element mechanically supported by the projections so that the piezoelectric transformer element is accommodated in an internal space defined by inner walls of the molded package but separated from the inner walls of the molded package. As a result, the thickness of the package can be reduced.

BRIEF DESCRIPTION OF THE DRAWINGS

Preferred embodiments according to the present invention will be described in detail with reference to the accompanying drawings.

DISCLOSURE OF THE INVENTION

The present invention provides a piezoelectric transformer comprising a molded package having first and second inner walls facing each other, a plurality of pairs of projections provided on the first and second inner walls, and a piezoelectric transformer element mechanically supported by the projections so that the piezoelectric transformer element is accommodated in an internal space defined by inner walls of the molded package but separated from the inner walls of the molded package. As a result, the thickness of the package can be reduced.

Wirings may be provided which extend onto the projections to obtain electrical contact with the piezoelectric transformer element via the projections.

Further, at least an opening may be formed in the vicinity of each of the projections so that each of the projections is capable of applying an elastic force to the piezoelectric transformer element. In this case, a plurality of the openings may be provided symmetrically around each of the projections.

Furthermore, at least a recessed portion may be formed on opposite outside walls of the molded package to form thickness-reduced portions in the molded package so that each of the projections is positioned on each of the thickness-reduced portions whereby each of the projections is capable of applying an elastic force to the piezoelectric transformer element.

Moreover, at least a recessed portion may be formed in the vicinity of each of the projections so that each of the projections is capable of applying an elastic force to the piezoelectric transformer element. In this case, a plurality of the recessed portions may be provided symmetrically around each of the projections.

The molded package may comprise first and second portions and the first portion has a plurality of snap fits and the second portion has a plurality of through holes at corresponding positions so that the snap fits snap into the through holes to latch the first and second portions.

The wirings may be provided which extend from the projections to outside walls of the molded package so as to obtain electrical contact with the piezoelectric transformer element via the projections and also to allow the piezoelectric transformer to be mounted on a printed board.

Each of the projections has a generally hemisphere shape.

Figure 6:
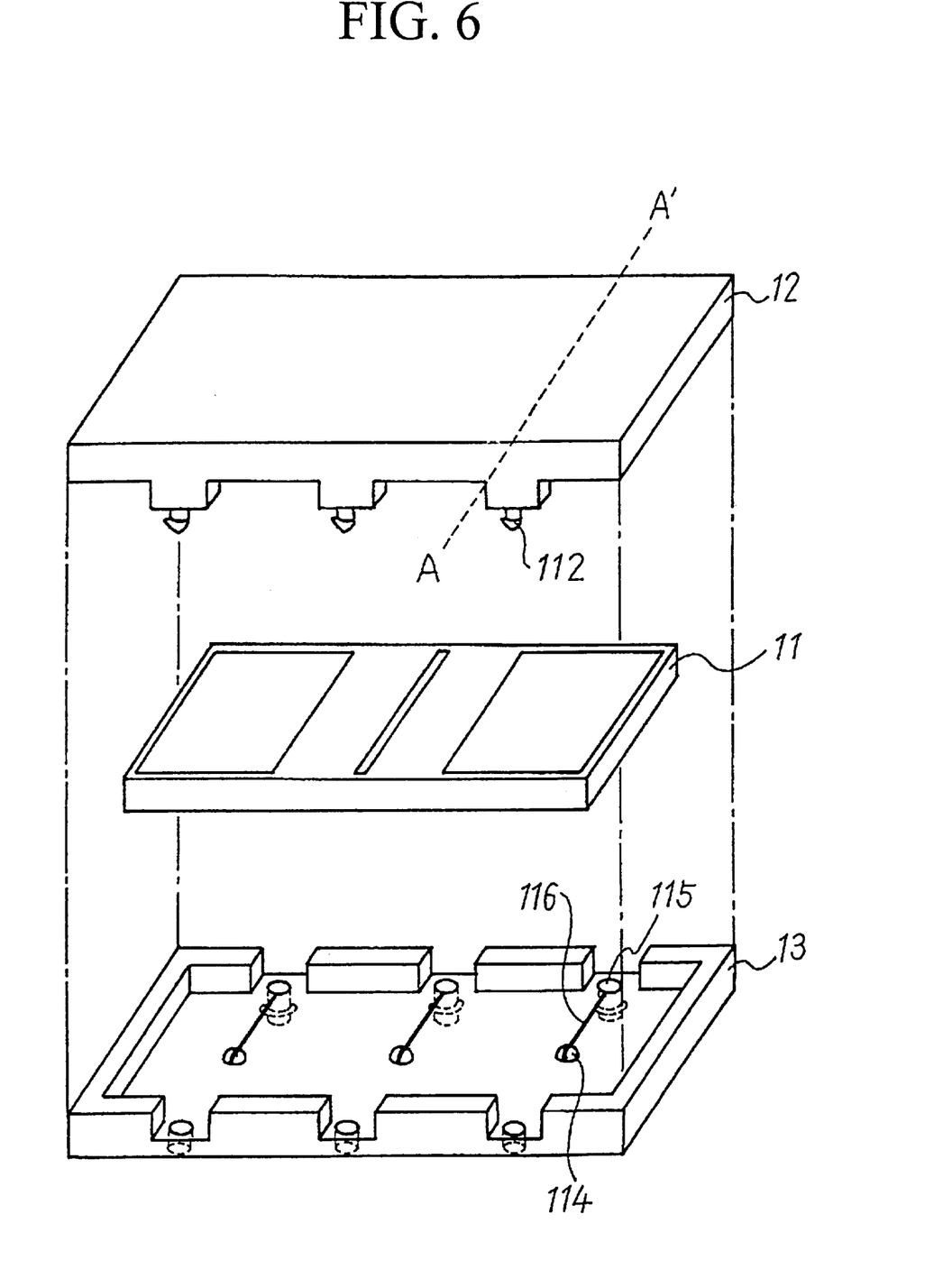
FIG. 6 is a schematic perspective view illustrative of a novel package structure of a piezoelectric transformer in a first embodiment according to the present invention.
Figure 7:
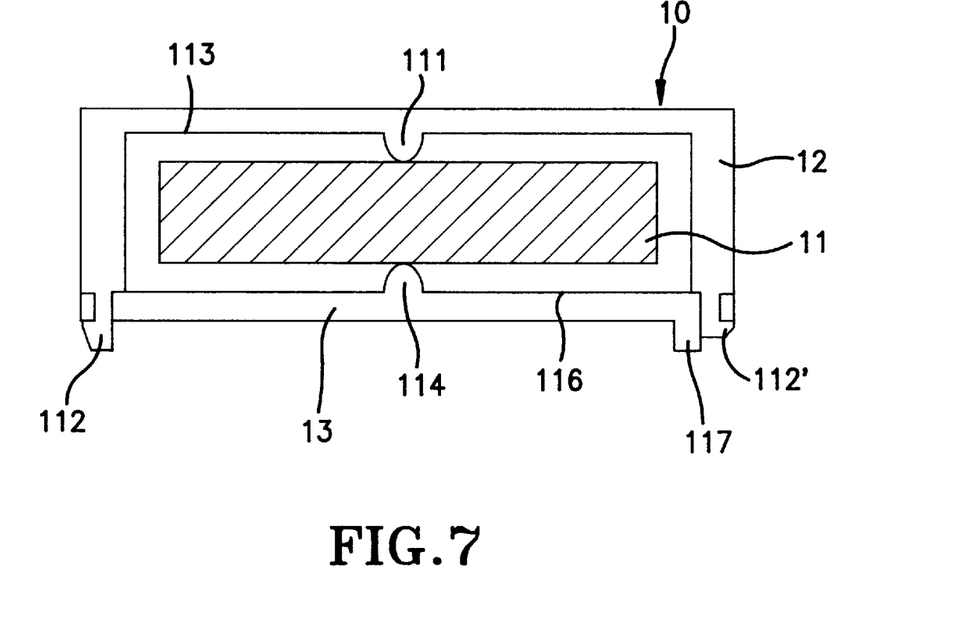
FIG. 7 is a cross sectional view illustrative of a novel package structure of a piezoelectric transformer in a first embodiment according to the present invention.

A first embodiment according to the present invention will be described in detail with reference to FIGS. 6 and 7. A piezoelectric transformer 11 is accommodated in an internal space defined by both an upper molded package 12 and a lower armor case 13. The upper molded package 12 has an inner face on which three projections 111 are provided. Each of the projections 111 has a generally hemisphere shape. The three projections 111 are aligned on a longitudinal center axis of the inner face of the upper molded package 12. The upper molded package 12 has a circumferential rim which continuously extends on the circumferential portion thereof. The circumferential rim has three step-projected portions on each of the longitudinal opposite sides. A snap fit 112 is provided on a top portion of the each step-projected portion of the circumferential rim. Each of the snap fit has a latch portion. The lower molded package 13 has an inner face on which three projections 114 are provided. Each of the projections 114 has a generally hemisphere shape. The three projections 114 are aligned on a longitudinal center axis of the inner face of the lower molded package 13. The lower molded package 14 has a circumferential rim which discontinuously extends on the circumferential portion thereof. The circumferential rim has three step-recessed portions on each of the longitudinal opposite sides so that the step-recessed portions are positioned in correspondence to the step-projected portion of the circumferential rim of the upper molded package 12. The step-recessed portion separates the discontinuously extending portions of the circumferential rim from each other. A thorough hole 115 is provided at each the step-recessed portion of the circumferential rim of the lower molded package 13. The thorough hole 115 is positioned in correspondence to the each snap fit 112 of the upper molded package 12 so that the each snap fit 112 snaps into the corresponding thorough hole 115 and the latch portion of the each snap fit 112 can latch the lower molded package 13 through the through hole 115.

Three first wirings 113 are provided which extend from the three projections 111 through the inner face of the upper molded package 12 to the three snap fits 112 aligned on the one longitudinal side. Further, three second wirings 116 are provided which extend from the three projections 114 through the inner face of the lower molded package 14 to the three through holes 115 aligned on the opposite longitudinal side. The first wirings 113 may be formed on a printed board. The second wirings 116 extend through the through holes 115 to the outer face of the lower molded package 13. On the bottom surfaces of the lower molded package 13 but in the vicinity of the through holes, convex portions 117 are provided which have the same height as the snap fits 112 aligned on the opposite side so as to allow a balanced packaging. The snap fits 112' provided on the opposite side to the side on which the snap fits 112 are provided, have a height slightly lower than the convex portions 117 to prevent the snap fits 112' from contacting the printed board. Since the second wirings 116 extend to the bottom and outer surface of the lower armor case 13, there is no possibility of electrical disconnection by the separation of the snap fits 112' from the through holes 115 due to thermal expansion and contraction.

The above piezoelectric transformer can be formed as follows. For the piezoelectric transformer element 11, a Nepeck-8 is used and shaped in a size of 42.0×10.0×1.0 mm. Input and output electrodes of Ag/Pd are printed and baked. Rosen of third order type having been polarization-treated The upper and lower molded packages 12 and 13 may be formed by molding a mold resin wherein the upper and lower molded packages 12 and 13 have the above described projections 111 and 114 and the snap fits 112 and 112'. The first and second wirings 113 and 116 may be formed by electroless plating of Cu as a base layer and Ni and Au using a mask. The wall thickness of the upper and lower molded packages 12 and 13 is 0.5 millimeters. The projections 111 and 114 have a size of R=0.5 millimeters and a height of 0.5 millimeters. The thicknesses of the platings of Cu, Ni, Au are 30 micrometers, 2–5 micrometers and 0.2 micrometers respectively.

The piezoelectric transformer element 11 and the upper and lower molded packages 12 and 13 are assembled and packaged to form the piezoelectric transformer 10.

The piezoelectric transformer 10 can directly mounted on the printed board by soldering. As a result, the thickness of the package is reduced to 3 millimeters. In contrast, the conventional package has a thickness of 5 millimeters. Both the wirings 113 and 116 extend to the bottom surface of the lower armor case for allowing the solder bonding between the piezoelectric transformer 10 and the printed board, even this structure is not essential. In this embodiment, the snap fits 112 and the through holes 115 are aligned on the same line on which the projections 111 and 114 are formed, even this structure is not essential. As a modification, the wirings 113 and 116 may extend to the side portions of the molded packages so that the lands of the printed board and the wirings 113 and 116 on the side portions of the armor cases may be solder-bonded. In any case, no wirings are formed at the through holes 115 and the snap fits 112.

The above piezoelectric transformer 10 was tested to evaluate characteristics thereof by use of a load of parallel connection of a resistance of 85 ohms and a capacitor of 5 pF. A transformation efficiency from the input power to the output power of the piezoelectric transformer is the same level as the conventional one's of 93%.

Figure 8A:
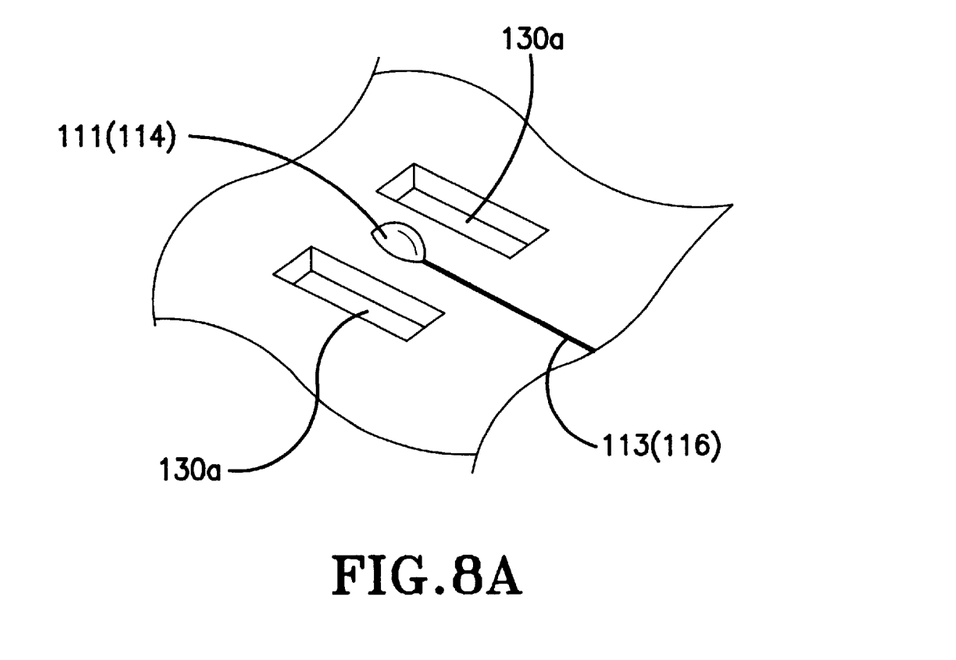
FIG. 8A is a fragmentary perspective view illustrative of an opening structure of the package in a second embodiment according to the present invention.

A second embodiment according to the present invention will be described in detail with reference to FIG. 8A which is a fragmentary perspective view illustrative of an opening structure of the package. The structural difference of the novel piezoelectric transformer of this embodiment from the first embodiment is only in providing openings 130a shown in FIG. 8A. The openings 130a are provided around each of the projections 111 and 114 which support the piezoelectric transformer element so that the projections 111 and 114 have an elasticity and a spring force whereby even if the piezoelectric transformer 10 receives an external shock, the projections 111 and 114 are kept in secure contact with the piezoelectric transformer element. In this embodiment, two of the opening 130a which is stripe-shaped or rectangular-shaped are provided at opposite sides of each of the projections 111 and 114. The other structures of the novel piezoelectric transformer 10 and effects provided thereby are the same as described in the first embodiment, for which reason the descriptions thereof will be omitted.

Figure 8B:
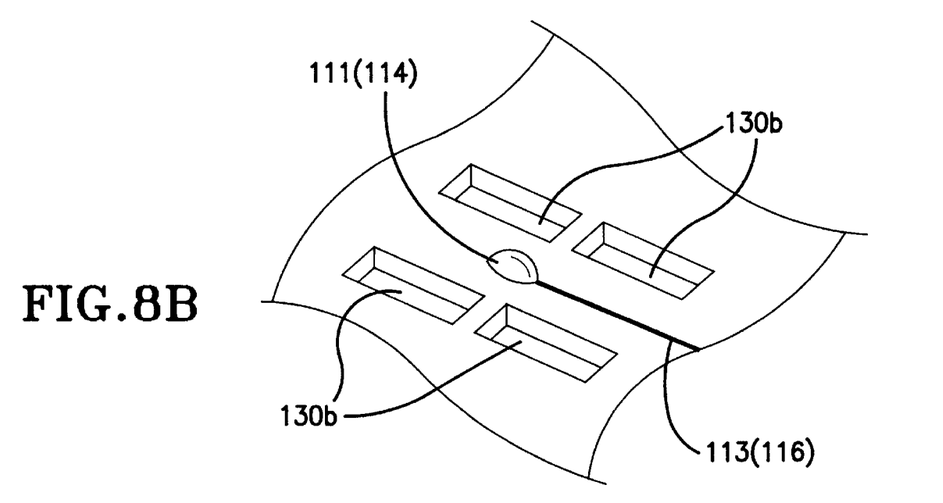
FIG. 8B is a fragmentary perspective view illustrative of an opening structure of the package in a third embodiment according to the present invention.

A third embodiment according to the present invention will be described in detail with reference to FIG. 8B which is a fragmentary perspective view illustrative of an opening structure of the package. The structural difference of the novel piezoelectric transformer of this embodiment from the first embodiment is only in providing openings 130a shown in FIG. 8B. The openings 130b are provided around each of the projections 111 and 114 which support the piezoelectric transformer element so that the projections 111 and 114 have an elasticity and a spring force whereby even if the piezoelectric transformer 10 receives an external shock, then the projections 111 and 114 are kept in secure contact with the piezoelectric transformer element. In this embodiment, four of the openings 130b which is stripe-shaped or rectangular-shaped are provided around each of the projections 111 and 114. The other structures of the novel piezoelectric transformer 10 and effects provided thereby are the same as described in the first embodiment, for which reason the descriptions thereof will be omitted.

Figure 8C:
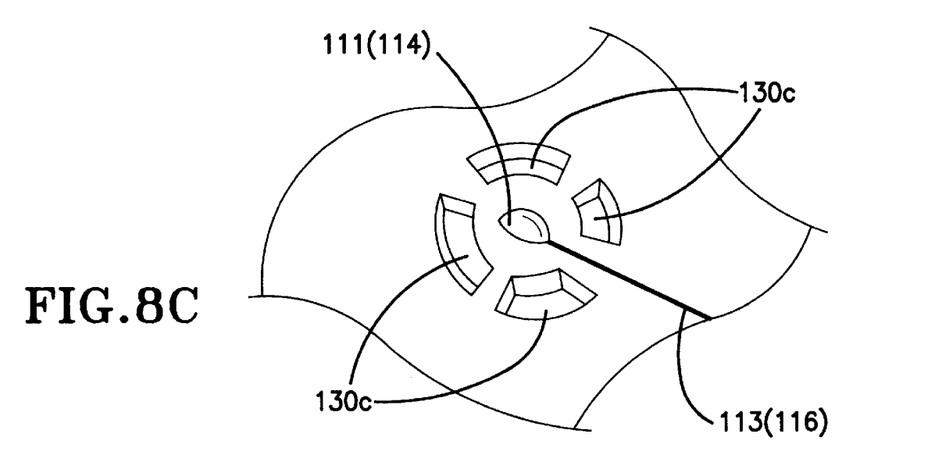
FIG. 8C is a fragmentary perspective view illustrative of an opening structure of the package in a fourth embodiment according to the present invention.

A fourth embodiment according to the present invention will be described in detail with reference to FIG. 8C which is a fragmentary perspective view illustrative of an opening structure of the package. The structural difference of the novel piezoelectric transformer of this embodiment from the first embodiment is only in providing openings 130c shown in FIG. 8C. The openings 130c are provided around each of the projections 111 and 114 which support the piezoelectric transformer element so that the projections 111 and 114 have an elasticity and a spring force whereby even if the piezoelectric transformer 10 receives an external shock, then the projections 111 and 114 are kept in secure contact with the piezoelectric transformer element. In this embodiment, four of the openings 130c which are arch-shaped are provided around each of the projections 111 and 114. The other structures of the novel piezoelectric transformer 10 and effects provided thereby are the same as described in the first embodiment, for which reason the descriptions thereof will be omitted.

Figure 8D:
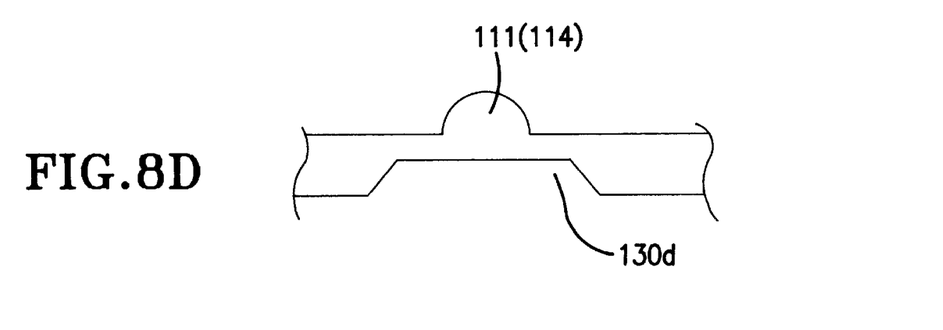
FIG. 8D is a fragmentary perspective view illustrative of a thickness-reduced structure of the package in a fifth embodiment according to the present invention.

A fifth embodiment according to the present invention will be described in detail with reference to FIG. 8D which is a fragmentary perspective view illustrative of an opening structure of the package. The structural difference of the novel piezoelectric transformer of this embodiment from the first embodiment is only in providing recessed portions 130*d* shown in FIG. 8D. The recessed portions 130*d* are provided on the opposite surface to the surface on which the projections 111 and 114 are provided. Namely, the thickness of the area in which the projection is provided is reduced so that the projections 111 and 114 have an elasticity and a spring force whereby even if the piezoelectric transformer 10 receives an external shock, then the projections 111 and 114 are kept in secure contact with the piezoelectric transformer element. The other structures of the novel piezoelectric transformer 10 and effects provided thereby are the same as described in the first embodiment, for which reason the descriptions thereof will be omitted.

As a modification, without use of the lower molded package, projections and through holes as well as wirings may be provided on a printed board so that the upper molded package is directly mounted on the printed board. In this case, the thickness of the package is further reduced to 2.5 millimeters. Substantially the same characteristics of the piezoelectric transformer could be confirmed.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A piezoelectric transformer comprising:
   a molded package having first and second inner walls facing each other;
   a plurality of pairs of projections provided on the first and second inner walls;
   a piezoelectric transformer element mechanically, supported by the projections so that the piezoelectric transformer element is accommodated in an internal space defined by the inner walls of the molded package but separated from the inner walls of the molded package; and
   at least an opening in the vicinity of each of the projections so that each of the projections applies an elastic force to the piezoelectric transformer element.

2. The piezoelectric transformer as claimed in claim 1, wherein wirings are provided which extend onto the projections to obtain electrical contact with the piezoelectric transformer element via the projections.

3. The piezoelectric transformer as claimed in claim 1, wherein wirings include at last a first type wiring and a second type wiring, said first type wiring extends from a first projection provided in a first side through a first inner wall in said first side and a first side wall to a second outside wall in a second side opposite to said first side, and said second type wiring extends from a second projection positioned in said second side through a second inner wall in said second side to said second outside wall.

4. The piezoelectric transformer as claimed in claim 3, wherein a plurality of the openings are provided symmetrically around each of the projections.

5. The piezoelectric transformer as claimed in claim 1, wherein each of the projections has a generally hemisphere shape.

6. A piezoelectric transformer comprising:
   a molded package having first and second inner walls facing each other;
   a plurality of pairs of projections provided on the first and second inner walls;
   a piezoelectric transformer element mechanically supported by the projections so that the piezoelectric transformer element is accommodated in an internal space defined by the inner walls of the molded package but separated from the inner walls of the molded package; and
   at least a recessed portion in the vicinity of each of the projections so that each of the projections applies an elastic force to the piezoelectric transformer element.

7. The piezoelectric transformer as claimed in claim 6, wherein a plurality of the recessed portions are provided symmetrically around each of the projections.

8. A piezoelectric transformer comprising:
   a molded package having first and second inner walls facing each other;
   a plurality of pairs of projections provided on the first and second inner walls; and
   a piezoelectric transformer element mechanically supported by the projections so that the piezoelectric transformer element is accommodated in an internal space defined by the inner walls of the molded package but separated from the inner walls of the molded package,
   wherein the molded package comprises first and second portions and the first portion has a plurality of snap fits and the second portion has a plurality of through holes at corresponding positions so that the snap fits snap into the through holes to latch the first and second portions.

9. A piezoelectric transformer comprising:
   a molded package having first and second inner walls facing each other;
   a plurality of pairs of projections provided on the first and second inner walls; and
   a piezoelectric transformer element mechanically supported by the projections so that the piezoelectric transformer element is accommodated in an internal space defined by the inner walls of the molded package but separated from the inner walls of the molded package,
   wherein each of the projections is positioned on a portion of the molded package with a reduced thickness whereby each of the projections applies an elastic force to the piezoelectric transformer element.

10. The piezoelectric transformer comprising:
    a molded package having first and second inner walls facing each other;
    a plurality of pairs of projections on the first and second inner walls;
    a piezoelectric transformer element supported by the projections so that the piezoelectric transformer element is in an internal space defined by the inner walls of the molded package; and
    wherein said molded package further comprises means for applying an elastic force to the projections to elastically and mechanically support the piezoelectric transformer element.

* * * * *